United States Patent
Bayruns

(10) Patent No.: US 7,764,942 B2
(45) Date of Patent: Jul. 27, 2010

(54) TUNING CIRCUITRY UTILIZING FREQUENCY TRANSLATION OF AN IMPEDANCE FROM A FIXED-FILTER FREQUENCY RESPONSE

(75) Inventor: John Thomas Bayruns, Bridgewater, NJ (US)

(73) Assignee: Anadigics, Inc., Warren, NJ (US)

( * ) Notice: Subject to any disclaimer, the term of this patent is extended or adjusted under 35 U.S.C. 154(b) by 508 days.

(21) Appl. No.: 11/825,414

(22) Filed: Jul. 6, 2007

(65) Prior Publication Data

US 2009/0011732 A1 Jan. 8, 2009

(51) Int. Cl.
*H04Q 7/00* (2006.01)

(52) U.S. Cl. .................. 455/334; 455/260; 455/326; 330/259

(58) Field of Classification Search ......... 455/255–260, 455/307, 313, 323, 326, 333, 334, 339; 330/252, 330/259
See application file for complete search history.

(56) References Cited

U.S. PATENT DOCUMENTS

| 5,715,282 | A  | * | 2/1998 | Mansouri et al. | 375/350 |
| 6,023,196 | A  | * | 2/2000 | Ashby et al. | 330/290 |
| 6,377,315 | B1 | * | 4/2002 | Carr et al. | 348/726 |
| 6,438,365 | B1 | * | 8/2002 | Balteanu | 455/326 |
| 6,944,438 | B2 | * | 9/2005 | Pellat et al. | 455/333 |
| 7,403,758 | B2 | * | 7/2008 | Rector | 455/232.1 |

* cited by examiner

*Primary Examiner*—Nhan Le
(74) *Attorney, Agent, or Firm*—William L. Botjer

(57) ABSTRACT

A circuit and method for tracking a local oscillator signal frequency in an RF tuner, for tuning input RF signals. The RF tuner includes a frequency-dependent impedance generator that generates a frequency-dependent impedance at the input by rejecting unwanted input RF signals and shunt feeding back the desired signal to the input. The desired signal frequency is centered at the local oscillator signal frequency. The frequency-dependent impedance generator is used with an amplifier circuit to generate a tracking amplifier, the frequency-dependent amplifier gain of which tracks the local oscillator signal frequency.

10 Claims, 9 Drawing Sheets

TUNING CIRCUITRY UTILIZING FREQUENCY TRANSLATION OF AN IMPEDANCE FROM A FIXED-FILTER FREQUENCY RESPONSE

BACKGROUND OF THE INVENTION

The present invention generally relates to RF tuners. More specifically, the present invention relates to a tracking amplifier and a band-pass impedance generator for tuning input RF signals.

Broadband cable and terrestrial systems offer consumers a wide range of channels, which are spread over a broad range of RF frequencies. RF frequencies are usually in the 50-860 MHz range, with each channel having a bandwidth of 6, 7 or 8 MHz. Various products, such as television sets, set-top boxes, computer systems, and the like, deploy RF tuners (also referred to as broadband tuners) to tune to a desired channel by filtering undesired channels without altering the information carried by the desired channel.

Various filtering techniques are used by RF tuners for channel selection, e.g., variable-frequency filters and fixed-frequency filters. Variable-frequency filters are usually used in Single Conversion Tuners (SCT) and fixed-frequency filters in Double Conversion Tuners. A Double Conversion Tuner uses a fixed-frequency band-pass filter such as a SAW filter, preceded and followed by mixing stages. The first mixing stage up-converts the entire block of input RF signal frequencies to an Intermediate Frequency IF1. The entire up-converted block of input RF signal frequencies is then passed through the fixed-frequency band-pass filter to reject undesired frequencies. The second mixing down-converts the desired channel frequency to a standard Intermediate Frequency (IF), which is used for further processing. However, the use of external band-pass filters downgrades the process of system integration and increases the cost. Further, the first up-conversion process for the entire block of the input RF signal frequencies increases power consumption, which, in turn, causes high power dissipation and thus heat.

A Single Conversion Tuner performs a single mixing operation. Prior to mixing, the input RF signal frequencies are passed through a variable input band-pass filter. The variable-frequency band-pass filter (also referred to as tracking filter) rejects all other frequencies except the desired signal (also referred to as an in-band signal) frequency. The in-band signal frequency is then down-converted to a standard Intermediate Frequency (IF) by using a mixer. The IF is used to process the signal further. However, the variable-frequency filters used in SCTs need to be extremely accurate, perform very efficiently, and have a high quality factor (Q). They require extremely accurate and precise variable filter elements such as hand-tunable, high-Q wire-wound inductors, and the like. However, these elements are difficult to integrate on a single chip.

In light of the foregoing, there is a need for an RF tuner that does not require external components such as a SAW filter and has improved power dissipation. Further, there is a need to do away with discrete components such as inductors, capacitors, diodes, and the like, which face significant difficulty during the process of integration.

SUMMARY

An object of the present invention is to generate a frequency-dependent impedance for tracking a local oscillator signal in an RF tuner.

Another object of the present invention is to provide a tracking amplifier for tracking an RF tuner parameter.

Another object of the present invention is to provide an RF tuner with a tracking amplifier at its front end, to generate the desired signal to facilitate desired channel selection.

Yet another object of the present invention is to provide an RF tuner with improved power dissipation and system integration.

To achieve the above-mentioned objectives, various embodiments of the present invention provide an RF tuner with a front-end tracking amplifier for tuning input RF signals. The RF tuner tunes to in-band signal frequency by tracking a local oscillator signal frequency. The in-band signal frequency is centered at the local oscillator signal frequency.

In an embodiment of the present invention, the tracking amplifier includes a frequency-dependent impedance generator. The frequency-dependent impedance generator includes a first I/Q mixer, a plurality of fixed-frequency filters, a second I/Q mixer, a summing module, and a transconductance amplifier. The first I/Q mixer mixes input RF signals with I/Q local oscillator signals to generate first I/Q paths. The plurality of fixed-frequency filters filter the first I/Q paths to remove undesired input RF signals, image signals and noise signals. The second I/Q mixer mixes the filtered I/Q paths with I/Q local oscillator signals to generate second I/Q paths. The summing module adds the second I/Q paths to generate a baseband signal, which is shunt fed back to the input of the first I/Q mixer through the transconductance amplifier. A frequency-dependent impedance is generated at the input of the first I/Q mixer. The frequency-dependent impedance is high for the out-of-band input RF signal frequencies and low for the in-band signal frequency. The in-band signal frequency is a function of the local oscillator signal frequency. The frequency-dependent impedance generator tracks the local oscillator signal frequency.

In another embodiment of the present invention, the frequency-dependent impedance generator is connected to a Field Effect Transistor (FET) differential amplifier circuit, to construct a tracking amplifier. The frequency-dependent impedance generator modifies the gain of the tracking amplifier, generating a frequency-dependent amplifier gain. The frequency-dependent amplifier gain tracks the local oscillator signal frequency.

In another embodiment of the present invention, the frequency-dependent impedance generator is used as a load impedance for a voltage amplifier, to construct a band-pass impedance generator. The frequency-dependent impedance of the frequency-dependent impedance generator modifies the band-pass impedance of the band-pass impedance generator. The band-pass impedance tracks the local oscillator signal frequency.

In yet another embodiment of the present invention, an RF tuner is designed by using at least one of the tracking amplifier and the band-pass impedance generator at the front-end. The at least one of the tracking amplifier and the band-pass impedance generator rejects all other input RF signal frequencies, except the in-band signal frequency. The in-band signal frequency is passed to a third mixer, which converts it to an Intermediate Frequency signal. The Intermediate Frequency signal is amplified and demodulated to extract the required audio/video signals for further processing.

Various elements of the RF tuner of the present invention can be implemented by using Bi-CMOS technology. This eliminates the need for a variable-frequency tracking filter that requires discrete components such as wire-wound inductors, which are difficult to integrate. Further, the RF tuner requires only one local oscillator signal generator to down-convert the in-band signal frequency to Intermediate Frequency. This improves the power dissipation of the RF tuner. Further, the RF tuner does not require a SAW filter. This facilitates system integration. Moreover, the RF tuner can be used in both the analog and the digital domain, since the components can be implemented with standard analog and standard digital technology.

BRIEF DESCRIPTION OF THE DRAWINGS

Various embodiments of the present invention will hereinafter be described in conjunction with the appended drawings, provided to illustrate and not to limit the invention, wherein like designations denote like elements, and in which.

DESCRIPTION OF PREFERRED EMBODIMENTS

Various embodiments of the present invention provide an RF tuner with a front-end tracking amplifier for tuning input RF signals. The RF tuner includes a frequency-dependent impedance generator. The frequency-dependent impedance generator generates a low frequency-dependent impedance at the input, for in-band signal frequency. The in-band signal frequency is the input RF signal frequency, centered at a local oscillator signal frequency. The frequency-dependent impedance generator is used with an amplifier circuit to generate a tracking amplifier with a peak gain for the in-band signal frequency. Thereby, the tracking amplifier tracks the local oscillator signal frequency.

Figure 1:
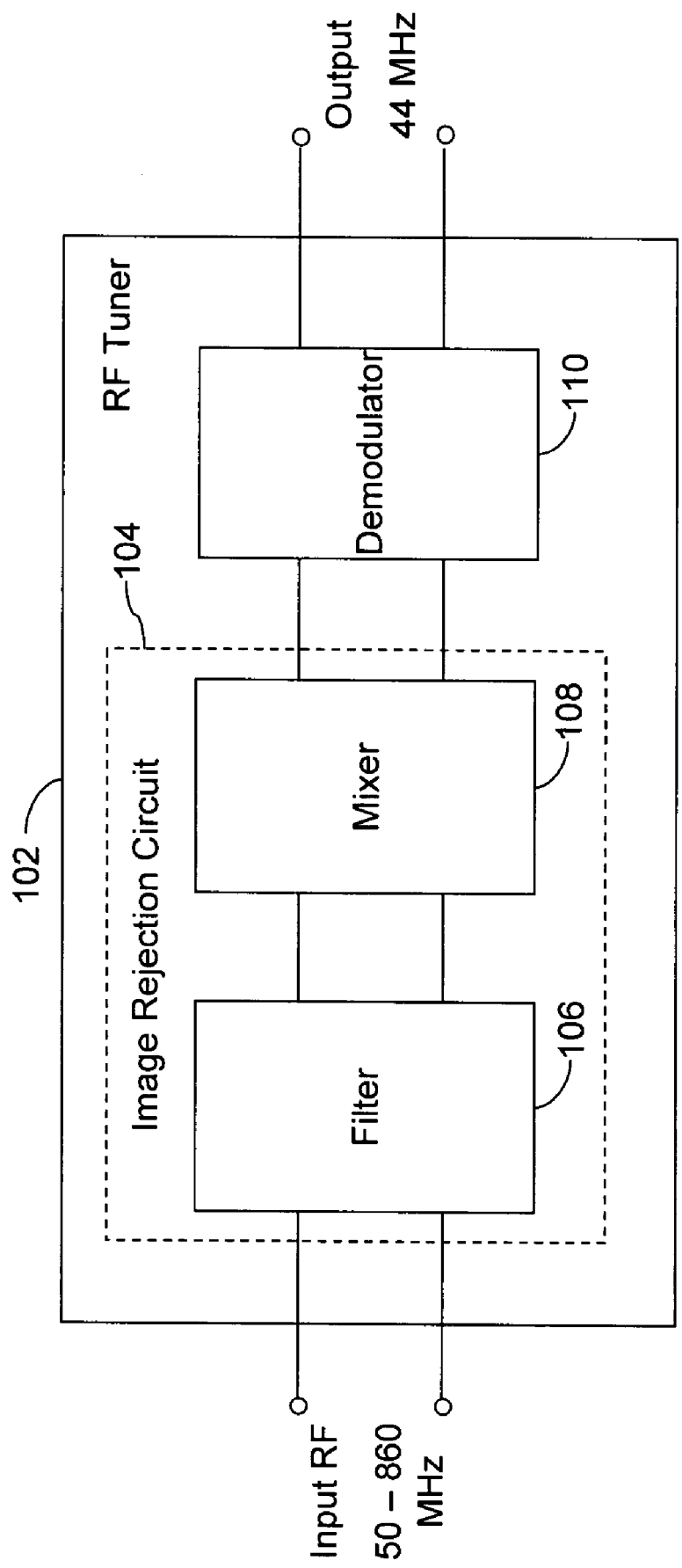
FIG. 1 is a block diagram of an RF tuner, in which various embodiments of the present invention may be implemented.

FIG. 1 is a block diagram of an RF tuner 102, in which various embodiments of the present invention may be implemented. RF tuner 102 includes an image rejection circuit 104 and a demodulator 110. Image rejection circuit 104 includes a filter 106 and a mixer 108.

RF tuner 102 receives differential input RF signal frequencies. The input RF signal frequencies contain a plurality of channels with an equal bandwidth. Filter 106 filters out-of-band signal frequencies, the image signal and the noise signal and passes the in-band signal frequency to mixer 108. Mixer 108 mixes the in-band signal frequency with a local oscillator signal frequency to generate an Intermediate Frequency (IF) signal. Demodulator 110 demodulates the IF signal to extract the required audio/video signals.

In various embodiments of the present invention, filter 106 tracks a receiver parameter, such as the local oscillator signal frequency, to pass the in-band signal frequency. In other words, local oscillator frequency is changed to obtain in-band signals with different frequencies. Accordingly, filter 106 is also referred to as a tracking filter. In various embodiments of the present invention, filter 106 may be a band-pass filter, a low-pass filter, and the like.

In accordance with various embodiments of the invention, RF tuner 102 rejects all other input RF frequencies except the in-band frequency by tracking the local oscillator signal frequency. This is achieved by generating a frequency-dependent impedance. A circuit for generating the frequency-dependent impedance is explained in accordance with FIG. 2. Further, an RF tuner with a frequency-dependent impedance generator is explained in conjunction with FIG. 8.

Figure 2:
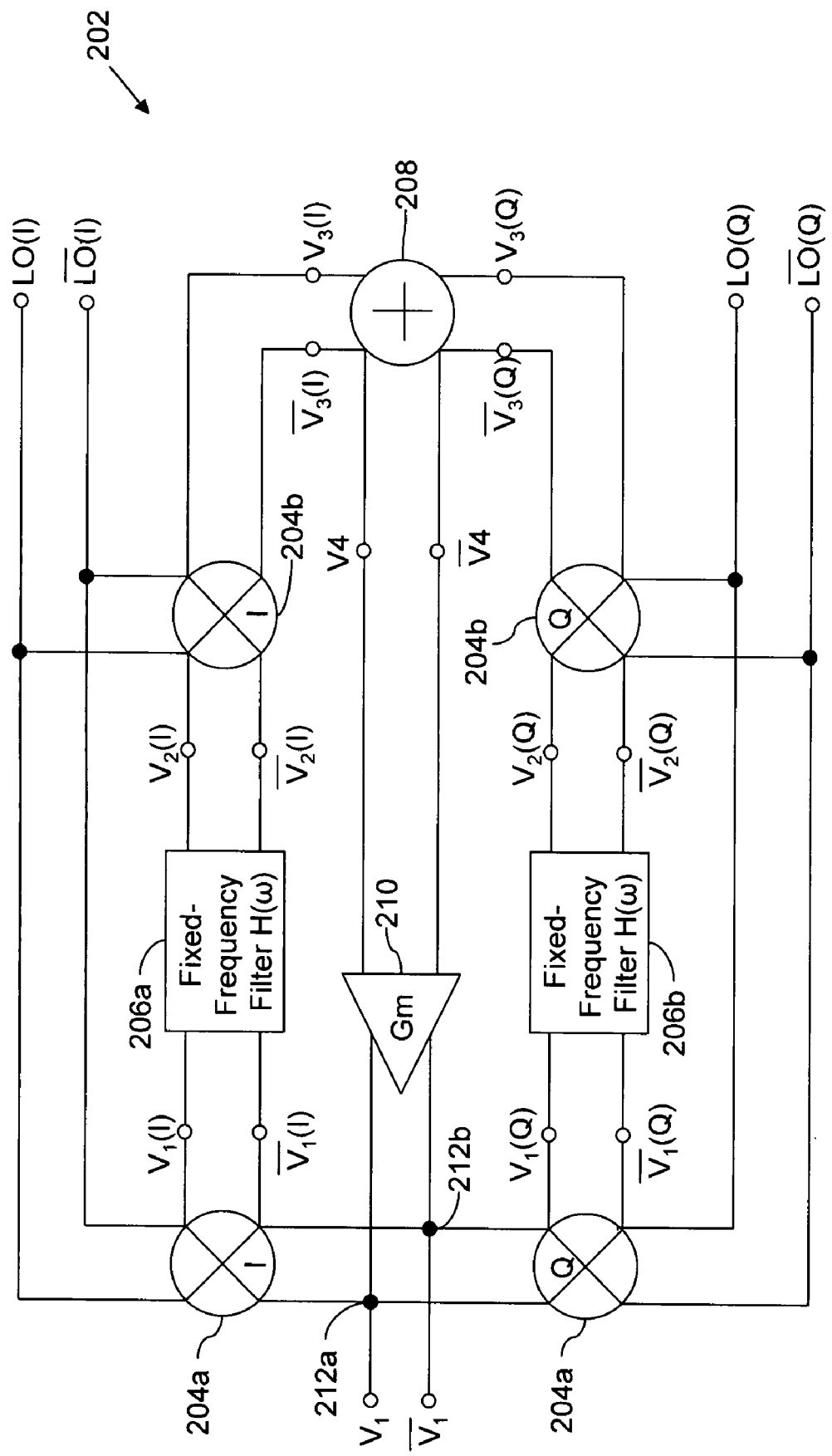
FIG. 2 is a block diagram of a frequency-dependent impedance generator, in accordance with an embodiment of the present invention.

FIG. 2 is a block diagram of a frequency-dependent impedance generator 202, in accordance with an embodiment of the present invention. Frequency-dependent impedance generator 202 (also referred to as $Z_{BR}$ block) includes a plurality of I/Q mixers, such as I/Q mixer 204a and I/Q mixer 204b, a plurality of fixed-frequency filters, such as fixed-frequency filter 206a and fixed-frequency filter 206b, a summing module 208, and a transconductance amplifier 210.

I/Q mixer 204a mixes the differential input RF signal frequencies with an in-phase (I) and a quadrature phase (Q) first local oscillator signal, to generate first I and Q paths, i.e., first I/Q paths. Fixed-frequency filters 206a and 206b filter the first I/Q paths. I/Q mixer 204b mixes the filtered I/Q paths with the I/Q first local oscillator signal to generate second I and Q paths, i.e., second I/Q paths. Summing module 208 adds the second I/Q paths to generate a baseband signal. The baseband signal is scaled by transconductance amplifier 210 and shunt fed back to the input, i.e., I/Q mixer 204a, at junction points 212a and 212b. Accordingly, the differential input RF signal frequencies mixed by I/Q mixer 204a and filtered by fixed-frequency filters 206a and 206b are not present in the feedback. In other words, a high impedance is generated at the input of I/Q mixer 204a for these frequencies. The differential input RF signal frequencies that are mixed by I/Q mixer 204a, passed by fixed-frequency filters 206a and 206b, remixed by I/Q mixer 204b and added by summing module 208 are fed back to the input through transconductance amplifier 210. In other words, a low impedance is generated at the input of I/Q mixer 204a. Thereby, a frequency-dependent impedance (also referred to as $Z_{BR}$) is generated at the input of I/Q mixer 204a.

The impedance of $Z_{BR}$ block 202 is high for the out-of-band input RF signal frequencies and low for the in-band signal frequency. Since the in-band signal frequency is centered at the first local oscillator frequency, $Z_{BR}$ block 202 tracks the first local oscillator signal frequency. In accordance with an embodiment of the present invention, $Z_{BR}$ block 202 is a notch filter (also referred to as a band-reject filter), which rejects all input RF signal frequencies within the notch frequency bandwidth.

In various embodiments of the present invention, fixed-frequency filters 206a and 206b may be band-pass filters, low-pass filters, or a combination of both. In one embodiment of the present invention, I/Q mixers 204a and 204b, fixed-frequency filters 206a and 206b, summing module 208 and transconductance amplifier 210 may be implemented with standard analog technology. In another embodiment of the present invention, I/Q mixers 204a and 204b, fixed-frequency filters 206a and 206b, summing module 208 and transconductance amplifier 210 may be implemented with standard digital technology. In another embodiment of the present invention, I/Q mixers 204a and 204b, fixed-frequency filters 206a and 206b, summing module 208 and transconductance amplifier 210 may be implemented with Bi-CMOS technology.

Figure 3:
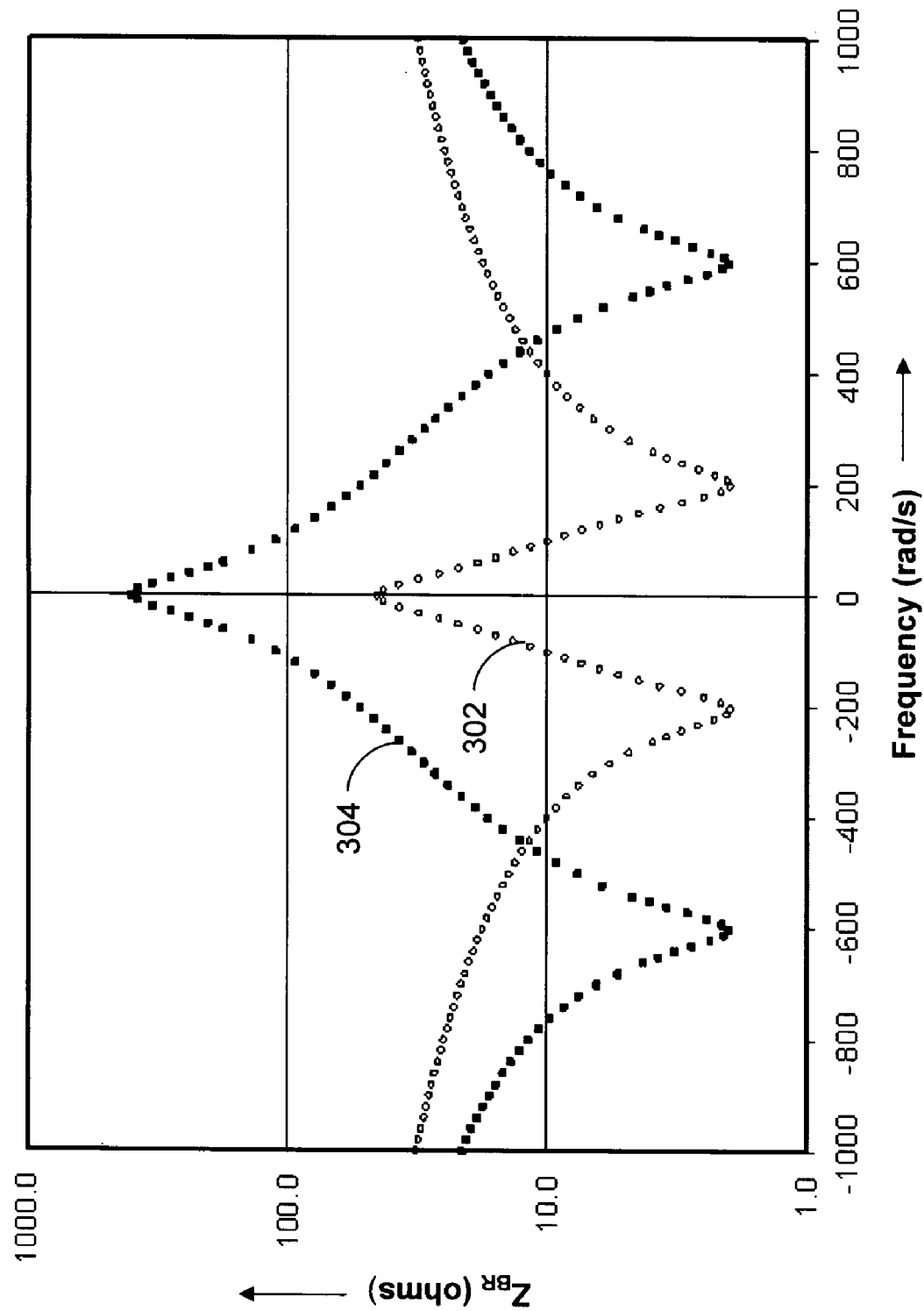
FIG. 3 is a graph illustrating the frequency response of the frequency-dependent impedance generator illustrated in FIG. 2, in accordance with an embodiment of the present invention.

FIG. 3 is a graph illustrating the frequency response of $Z_{BR}$ block 202 illustrated in FIG. 2, in accordance with an embodiment of the present invention. The X-axis represents the RF input signal frequency in radians/second. The Y-axis represents frequency-dependent impedance $Z_{BR}$. Curve 302 illustrates the variation of frequency-dependent impedance $Z_{BR}$ generated by $Z_{BR}$ block 202 for an exemplary first local oscillator signal frequency of 200 rad/s. Curve 304 illustrates the variation of frequency-dependent impedance $Z_{BR}$ generated by $Z_{BR}$ block 202 for another exemplary first local oscillator signal frequency of 600 rad/s. Curves 302 and 304 are generated by assuming a unity transconductance gain of transconductance amplifier 210.

Curve 302 shows that frequency-dependent impedance $Z_{BR}$ is the lowest for the input RF signal frequency centered at the first local oscillator signal frequency of 200 rad/s. For all other input RF frequencies, frequency-dependent impedance $Z_{BR}$ is high. Similarly, curve 304 shows that frequency-dependent impedance $Z_{BR}$ is the lowest for the input RF signal frequency centered at the first local oscillator signal frequency of 600 rad/s, and is high for all other input RF frequencies.

Therefore, $Z_{BR}$ block 202 generates low frequency-dependent impedance $Z_{BR}$ at the input for the in-band signal frequency, i.e., for the input RF signal frequency centered at the first local oscillator frequency. Hence, the frequency-dependent impedance $Z_{BR}$ generated by $Z_{BR}$ block 202 tracks the first local oscillator signal frequency.

Figure 4:
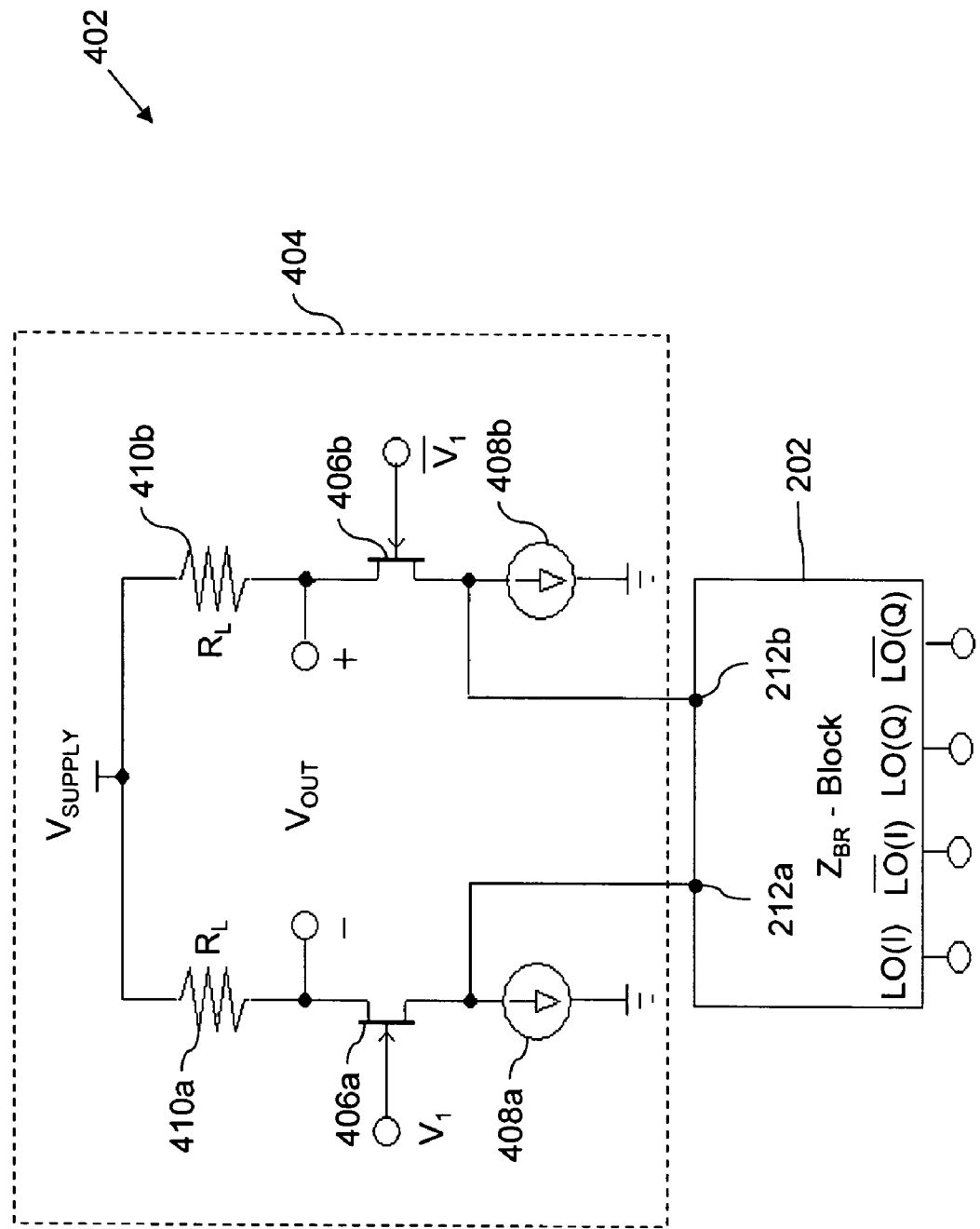
FIG. 4 is a block diagram of a tracking amplifier for tracking a local oscillator signal frequency, in accordance with an embodiment of the present invention.

FIG. 4 is a block diagram of tracking amplifier 402 for tracking the first local oscillator signal frequency, in accordance with an embodiment of the present invention. Tracking amplifier 402 includes an amplifier circuit 404 and $Z_{BR}$ block 202. Amplifier circuit 404 is a Field Effect Transistor (FET) differential amplifier circuit, which includes two n-channel Metal Oxide Semiconductor (NMOS) transistors, 406a and 406b, which are connected in parallel with two current sources, 408a and 408b, respectively. Two load impedances ($R_L$), 410a and 410b, are connected between supply voltage $V_{SUPPLY}$ and the drain regions of NMOS transistors 406a and 406b, respectively. Differential input RF signals are applied to the gate regions of NMOS transistors 406a and 406b. Differential output $V_{OUT}$ is obtained across load impedances 410a and 410b. Junction points 212a and 212b of $Z_{BR}$ block 202 are connected to the source regions of NMOS transistors 406a and 406b, respectively.

Frequency-dependent impedance $Z_{BR}$ generated by $Z_{BR}$ block 202 modifies the effective transconductance, $gm_{eff}$, represented by, $$gm_{eff} = \frac{gm}{1 + gm \times Z_{BR}} \quad (1)$$

where,
$gm_{eff}$=effective transconductance of amplifier circuit 404,
$gm$=transconductance of NMOS transistors 406a and 406b, and
$Z_{BR}$=frequency-dependent impedance
In equation (1), if the gm is selected as 1S (Siemens), equation 1 reduces to $$gm_{eff} = \frac{1}{1 + Z_{BR}} \quad (2)$$

For higher values of $Z_{BR}$, we can assume, $$(1+Z_{BR}) \approx Z_{BR} \quad (3)$$

Accordingly, equation (2) reduces to, $$gm_{eff} = \frac{1}{Z_{BR}} \quad (4)$$

Therefore the effective transconductance $gm_{eff}$ is in inverse proportion to frequency-dependent impedance $Z_{BR}$. In other words, a frequency-dependent transconductance $gm_{eff}$ is generated.

A differential output $V_{OUT}$ is obtained across load impedances 410a and 410b, which has a frequency-dependent amplifier gain of ($gm_{eff}*R_L$). According to equation (4), when frequency-dependent impedance $Z_{BR}$ is high, frequency-dependent transconductance $gm_{eff}$ has the lowest value. Hence, frequency-dependent amplifier gain ($gm_{eff}*R_L$) is the lowest for the out-of-band input RF signal frequencies. Similarly, when frequency-dependent impedance $Z_{BR}$ is the least for the in-band signal frequency passed by $Z_{BR}$ block 202, frequency-dependent transconductance $gm_{eff}$ has the highest value. Therefore, frequency-dependent amplifier gain ($gm_{eff}*R_L$) is the highest at the in-band signal frequency, which is centered at the first oscillator signal frequency. Hence, frequency-dependent amplifier gain ($gm_{eff}*R_L$) of tracking amplifier 402 tracks the first local oscillator signal frequency.

In an embodiment of the present invention, amplifier circuit 404 may be a bipolar junction transistor (BJT) differential amplifier circuit. Accordingly, the emitters of the two BJTs of the differential amplifier circuit are connected to junction points 212a and 212b of frequency-dependent impedance generator 202. In one embodiment of the present invention, $Z_{BR}$ block 202 and amplifier circuit 404 may be implemented with standard analog technology. In another embodiment of the present invention, $Z_{BR}$ block 202 and amplifier circuit 404 may be implemented with standard digital technology. In various embodiments of the present invention, $Z_{BR}$ block 202 and amplifier circuit 404 may be implemented with Bi-CMOS technology.

Figure 5:
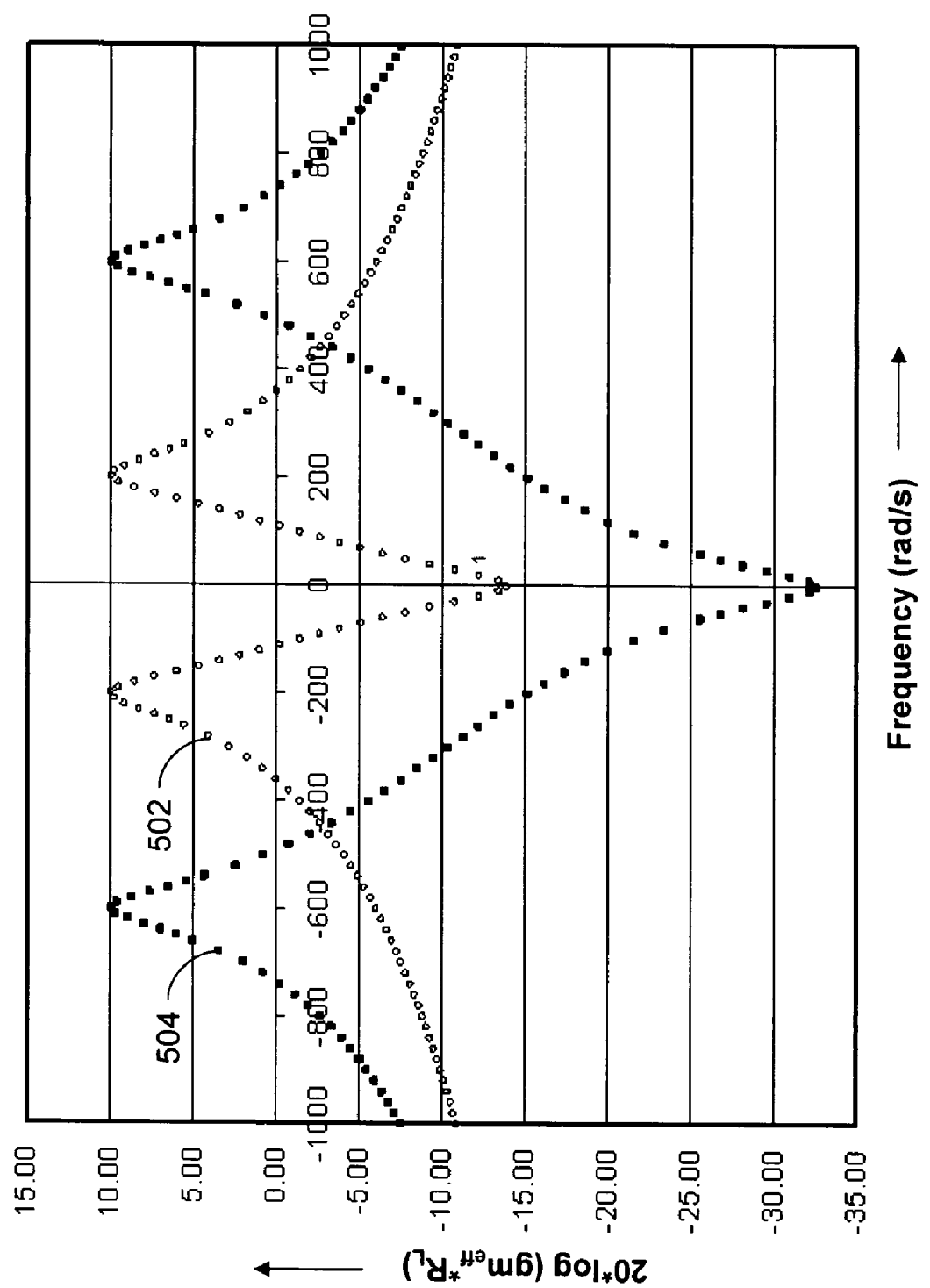
FIG. 5 is a graph illustrating the frequency response of the tracking amplifier illustrated in FIG. 4, in accordance with an embodiment of the present invention.

FIG. 5 is a graph illustrating the frequency response of tracking amplifier 402, illustrated in FIG. 4, in accordance with an embodiment of the present invention. The X-axis represents the RF input signal frequency in radians/second. The Y-axis represents frequency-dependent amplifier gain ($gm_{eff}*R_L$) in decibels (dB). Curve 502 illustrates the variation of frequency-dependent amplifier gain ($gm_{eff}*R_L$) generated by tracking amplifier 402 in dB for an exemplary first local oscillator signal frequency of 200 rad/s. Curve 504 illustrates the variation of frequency-dependent amplifier gain ($gm_{eff}*R_L$) generated by tracking amplifier 402 in dB for another exemplary first local oscillator signal frequency of 600 rad/s. Curves 502 and 504 are generated by assuming a unity transconductance for NMOS transistors 406a and 406b in amplifier circuit 404. Load impedance $R_L$ is selected for a peak gain of 10 dB.

Curve 502 shows that frequency-dependent amplifier gain ($gm_{eff}*R_L$) attains a peak of 10 dB for the input RF signal frequency centered at the first local oscillator signal frequency of 200 rad/s. This is the in-band signal frequency. Frequency-dependent amplifier gain ($gm_{eff}*R_L$) is low for all other input RF signal frequencies. Similarly, curve 504 shows that frequency-dependent amplifier gain ($gm_{eff}*R_L$) attains a peak of 10 dB for the input RF signal frequency centered at the first local oscillator signal frequency of 600 rad/s. This is the in-band signal frequency. Frequency-dependent amplifier gain ($gm_{eff}*R_L$) is low for all other input RF signal frequencies.

Therefore, tracking amplifier 402 generates a peak frequency-dependent amplifier gain ($gm_{eff}*R_L$) for the in-band signal frequency, i.e., for the input RF signal frequency centered at the first local oscillator signal frequency. Hence, frequency-dependent impedance gain ($gm_{eff}*R_L$) generated by tracking amplifier 402 tracks the first local oscillator signal frequency.

Figure 6:
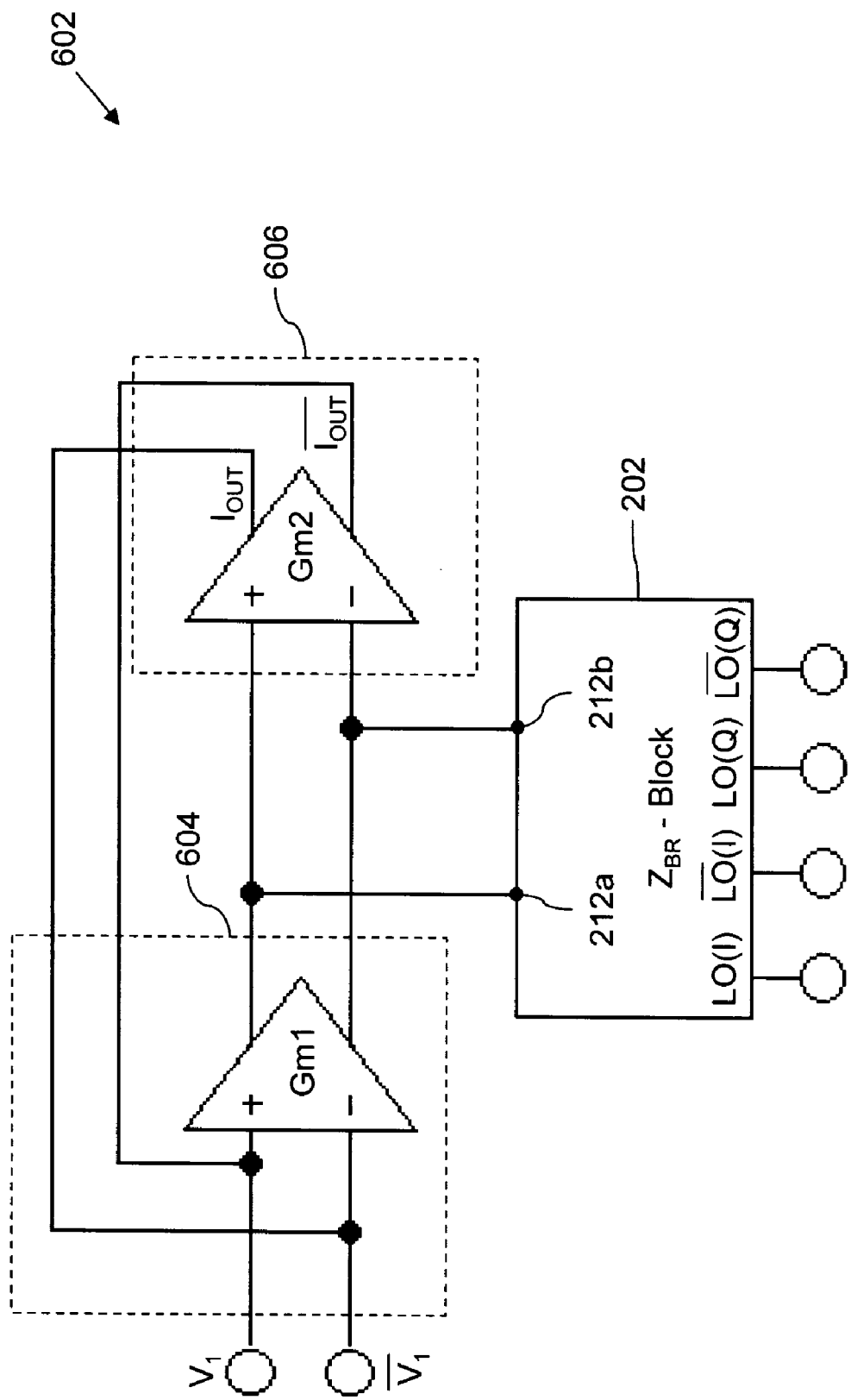
FIG. 6 is a block diagram of a band-pass impedance generator for tracking a local oscillator signal frequency, in accordance with an embodiment of the present invention.

FIG. 6 is a block diagram of band-pass impedance generator 602 for tracking the first local oscillator signal frequency, in accordance with an embodiment of the present invention. Band-pass impedance generator 602 includes a voltage amplifier 604, $Z_{BR}$ block 202 and a transconductance block 606. Differential input RF signals are applied to the differential inputs of voltage amplifier 604. Junction points 212a and 212b of $Z_{BR}$ block 202 are connected to the differential output stage of voltage amplifier 604. $Z_{BR}$ block 202 functions as a load impedance $Z_{BR}$ for voltage amplifier 604. The differential output of voltage amplifier 604 is fed back to the input of voltage amplifier 604 through transconductance block 606.

The transfer function of the band-pass impedance generator 602, $$\frac{V_{IN}}{I_{OUT}}$$

is given by, $$\frac{V_{IN}}{I_{OUT}} = Z_{BP} = \frac{1}{Gm1 \cdot Gm2 \cdot Z_{BR}} \quad (5)$$

Where,
$V_{IN}=(V_1-\overline{V_1})$=differential input RF signal of voltage amplifier 604,
$I_{OUT}$=differential output of the transconductance block 606,
$Z_{BR}$=load impedance,
Gm1=transconductance gain of voltage amplifier 604,
Gm2=transconductance gain of transconductance block 606, and
$Z_{BP}$=band-pass impedance of band-pass impedance generator 602

Band-pass impedance $Z_{BP}$ is maximum when frequency-dependent impedance $Z_{BR}$ is low for the in-band signal frequency centered at the first local oscillator signal frequency. Similarly, band-pass impedance $Z_{BP}$ is low for the out-of-band input RF signal frequencies as $Z_{BR}$ is high. Accordingly, since band-pass impedance $Z_{BP}$ is at its peak only for the in-band signal frequency centered at the first local oscillator frequency, band-pass impedance $Z_{BP}$ tracks the first local oscillator frequency.

In one embodiment of the present invention, voltage amplifier 604, $Z_{BR}$ block 202 and transconductance block 606 may be implemented with standard analog technology. In another embodiment of the present invention, voltage amplifier 604, $Z_{BR}$ block 202 and transconductance block 606 may be implemented with standard digital technology. In various embodiments of the present invention, voltage amplifier 604, $Z_{BR}$ block 202 and transconductance block 606 may be implemented with Bi-CMOS technology.

Figure 7:
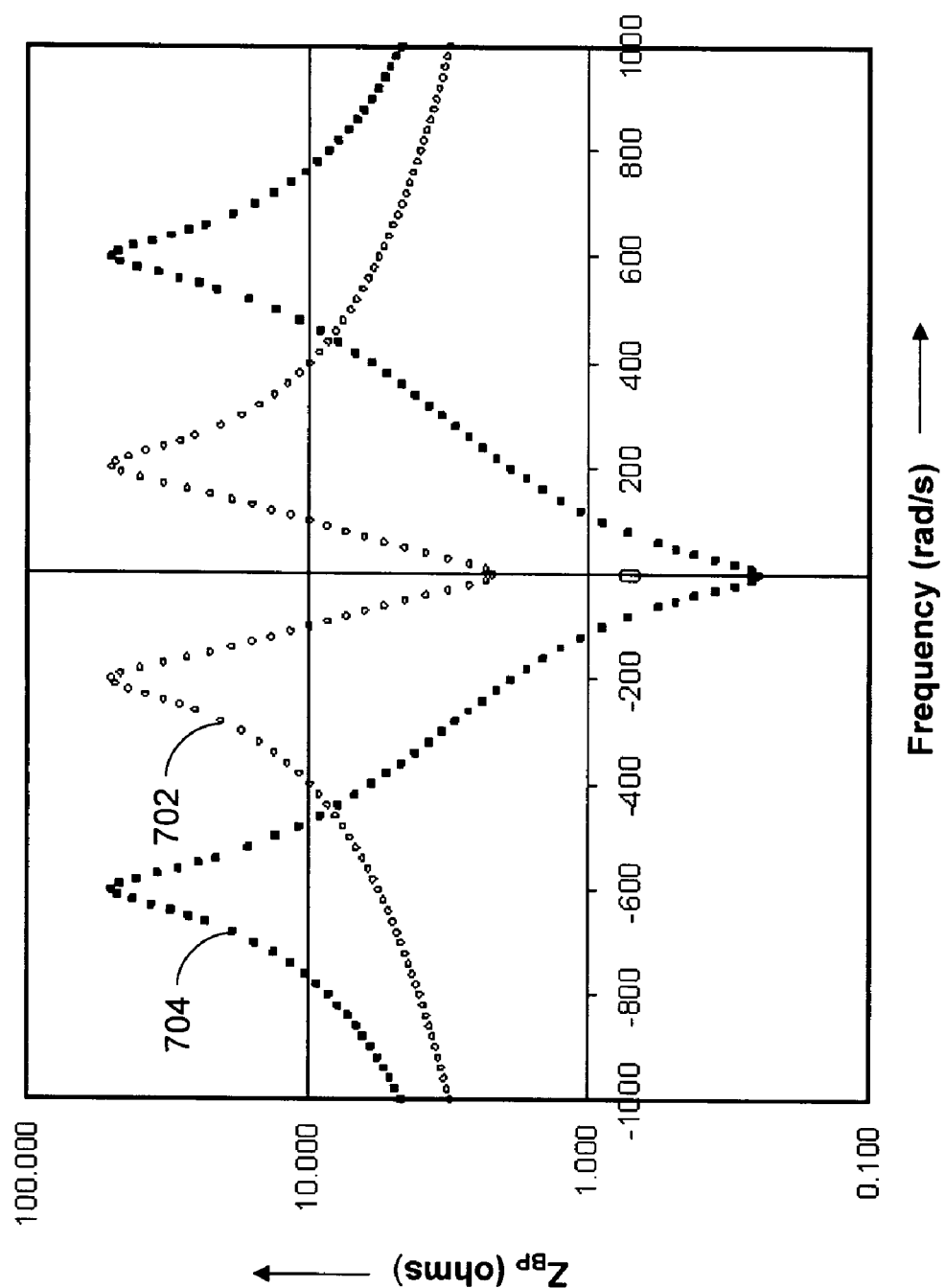
FIG. 7 is a graph illustrating the frequency response of the band-pass impedance generator illustrated in FIG. 6, in accordance with an embodiment of the present invention.

FIG. 7 is a graph illustrating the frequency response of band-pass impedance generator 602, illustrated in FIG. 6, in accordance with an embodiment of the present invention. The X-axis represents the RF input signal frequency in radians/second. The Y-axis represents band-pass impedance $Z_{BP}$. Curve 702 illustrates the variation of band-pass impedance $Z_{BP}$ generated by band-pass impedance generator 602 for an exemplary first local oscillator signal frequency of 200 rad/s. Curve 704 illustrates the variation of band-pass impedance $Z_{BP}$ generated by band-pass impedance generator 602 for another exemplary first local oscillator signal frequency of 600 rad/s.

Curve 702 shows that band-pass impedance $Z_{BP}$ is the highest for the input RF signal frequency centered at the first local oscillator signal frequency of 200 rad/s. This is the in-band signal frequency. Band-pass impedance $Z_{BP}$ is low for all other input RF signal frequencies. Similarly, curve 704 shows that band-pass impedance $Z_{BP}$ is the highest for the input RF signal frequency centered at the first local oscillator signal frequency of 600 rad/s. This is the in-band signal frequency. Band-pass impedance $Z_{BP}$ is low for all other input RF signal frequencies.

Therefore, band-pass impedance generator 602 generates peak band-pass impedance $Z_{BP}$ for the in-band signal frequency, i.e., for the input RF signal frequency centered at the first local oscillator signal frequency. Hence, band-pass impedance $Z_{BP}$ generated by band-pass impedance generator 602 tracks the first local oscillator signal frequency.

Figure 8:
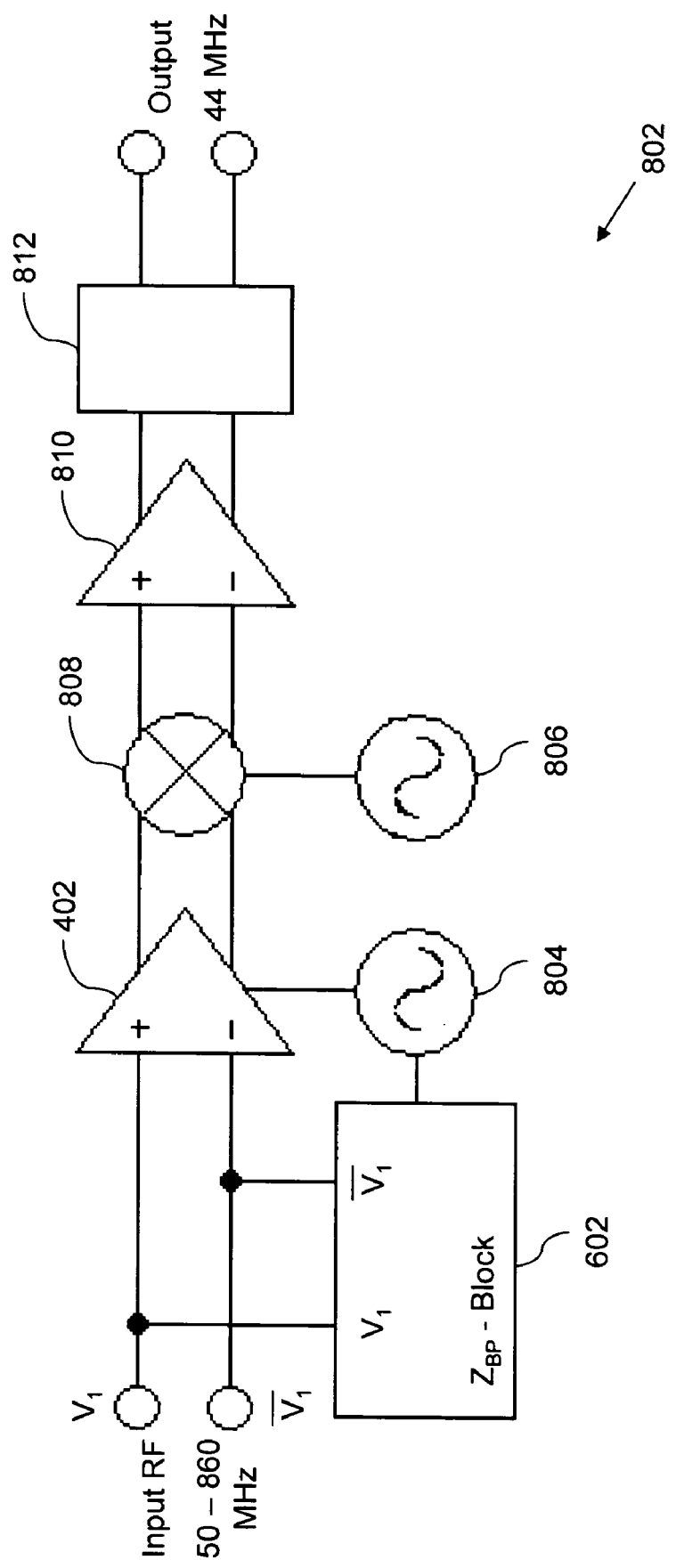
FIG. 8 is a block diagram of an RF tuner, in accordance with an embodiment of the present invention.

FIG. 8 is a block diagram of an RF tuner 802, in accordance with an embodiment of the present invention. RF tuner 802 includes tracking amplifier 402, band-pass impedance generator 602, a plurality of I/Q mixers, such as I/Q mixer 808, an IF amplifier 810, and a demodulator 812. Tracking amplifier 402 and band-pass impedance generator 602 are driven by a local oscillator 804, hereinafter referred to as LO 804. LO 804 generates the first local oscillator signal. Local oscillator 806, hereinafter referred to as LO 806, provides the second local oscillator signal to I/Q mixer 808.

Input RF signal frequencies are fed to tracking amplifier 402 and band-pass impedance generator 602. The input RF signal frequencies contain a plurality of channels with equal bandwidth. For example, the plurality of channels may have a bandwidth of 6 MHz each. These plurality of channels may be spread over a range of 50 to 860 MHz. Tracking amplifier 402 and band-pass impedance generator 602 are designed with equal bandwidth, which is one channel wide, i.e., 6 MHz. Tracking amplifier 402 attains a peak frequency-dependent amplifier gain ($gm_{eff}*R_L$) in the pass-band, i.e., a peak gain for the in-band signal frequency. For input RF signal frequencies other than the in-band signal frequency, tracking amplifier 402 has a low frequency-dependent amplifier gain ($gm_{eff}*R_L$). Similarly, band-pass impedance generator 602 has high band-pass impedance $Z_{BP}$ in the pass-band, i.e., high band-pass impedance $Z_{BP}$ for the in-band signal frequency. For input RF signal frequencies other than the in-band signal frequency, band-pass impedance generator 602 has low band-pass impedance $Z_{BP}$. The output of tracking amplifier 402 and band-pass impedance generator 602 is the in-band signal frequency. In other words, all frequencies outside the in-band signal frequency range are rejected. I/Q mixer 808 mixes the in-band signal with the second local oscillator signal to generate an Intermediate Frequency (IF) signal. IF amplifier 810 amplifies the IF signal. Demodulator 812 demodulates the amplified IF signal to extract the required audio/video signals for further processing.

In an embodiment of the present invention, RF tuner 802 is a Single Conversion Tuner (SCT). LO 804 and LO 806 generate local oscillator signals with different frequencies for a SCT. The second local oscillator signal frequency is offset from the first local oscillator signal frequency by a value that is equivalent to IF. I/Q mixer 808 may down-convert or up-convert the in-band signal frequency for a SCT. The Intermediate Frequency (IF) is selected accordingly. As a result, the output of I/Q mixer 808 is the Intermediate Frequency (IF) signal.

In another embodiment of the present invention, RF tuner 802 is a Direct Conversion Tuner. For a Direct Conversion Tuner, both LO 804 and LO 806 generate local oscillator signals with the same frequency, i.e., the first local oscillator signal and the second local oscillator signal have the same frequency. As a result, the output of I/Q mixer 808 is the Intermediate Frequency (IF) signal with a frequency of 0 MHz.

In one embodiment of the present invention, $Z_{BR}$ block 202, tracking amplifier 402, band-pass impedance generator 602, I/Q mixer 808, IF amplifier 810 and demodulator 812 may be implemented with standard analog technology. In another embodiment of the present invention, $Z_{BR}$ block 202, tracking amplifier 402, band-pass impedance generator 602, I/Q mixer 808, IF amplifier 810 and demodulator 812 may be implemented with standard digital technology. In various embodiments of the present invention, $Z_{BR}$ block 202, tracking amplifier 402, band-pass impedance generator 602, I/Q mixer 808, IF amplifier 810 and demodulator 812 may be implemented with Bi-CMOS technology.

The functioning of RF tuner 802 is explained with the help of the following example. An input RF signal has eight channels, and each channel is 6 MHz wide. These eight channels are centered at 100 MHz, 200 MHz, 300 MHz, 400 MHz, 500 MHz, 600 MHz, 700 MHz and 800 MHz, respectively. For an in-band signal frequency of 400 MHz, LO 804 is tuned to supply the first local oscillator signal with a frequency of 400 MHz. Accordingly, tracking amplifier 402 attains a peak frequency-dependent amplifier gain ($gm_{eff}*R_L$) for the in-band signal frequency of 400 MHz, while frequency-dependent amplifier gain ($gm_{eff}*R_L$) is low (ideally zero) for the input RF signal frequencies of 100 MHz, 200 MHz, 300 MHz, 500 MHz, 600 MHz, 700 MHz and 800 MHz. Thereby, tracking amplifier 402 only passes the in-band signal frequency of 400 MHz to I/Q mixer 808. Similarly, band-pass impedance generator 602 has finite band-pass impedance $Z_{BP}$ for the in-band signal frequency of 400 MHz. Band-pass impedance generator 602 has the low band-pass impedance $Z_{BP}$ (ideally zero) for input RF signal frequencies of 100 MHz, 200 MHz, 300 MHz, 500 MHz, 600 MHz, 700 MHz and 800 MHz. Thereby, band-pass impedance generator 602 only passes the desired signal frequency of 400 MHz to I/Q mixer 808.

LO 806 is tuned to generate the second local oscillator signal with a frequency offset from the first local oscillator signal frequency by a value equivalent to Intermediate Frequency (IF) for a SCT. For an Intermediate Frequency (IF) of 44 MHz, LO 806 is tuned to generate the second local oscillator signal with a frequency of 444 MHz. The frequency conversion process for I/Q mixer 808 is assumed to be a down-conversion process. I/Q mixer 808 mixes the in-band signal frequency of 400 MHz with the second local oscillator signal frequency of 444 MHz to generate an Intermediate Frequency (IF) of 44 MHz. IF amplifier 810 amplifies the Intermediate Frequency (IF) of 44 MHz. Demodulator 812 demodulates the amplified Intermediate Frequency (IF) of 44 MHz to extract the required audio/video signals for further processing.

For a Direct Conversion Tuner, LO 806 is tuned to generate the second local oscillator signal with a frequency that is the same as the first local oscillator signal frequency, i.e., 400 MHz. I/Q mixer 808 mixes the in-band signal frequency of 400 MHz with the second local oscillator signal frequency of 400 MHz to generate an Intermediate Frequency (IF) of 0 MHz. IF amplifier 810 amplifies the Intermediate Frequency (IF) of 0 MHz. Demodulator 812 demodulates the amplified IF of 0 MHz to extract the required audio/video signals for further processing.

Figure 9:
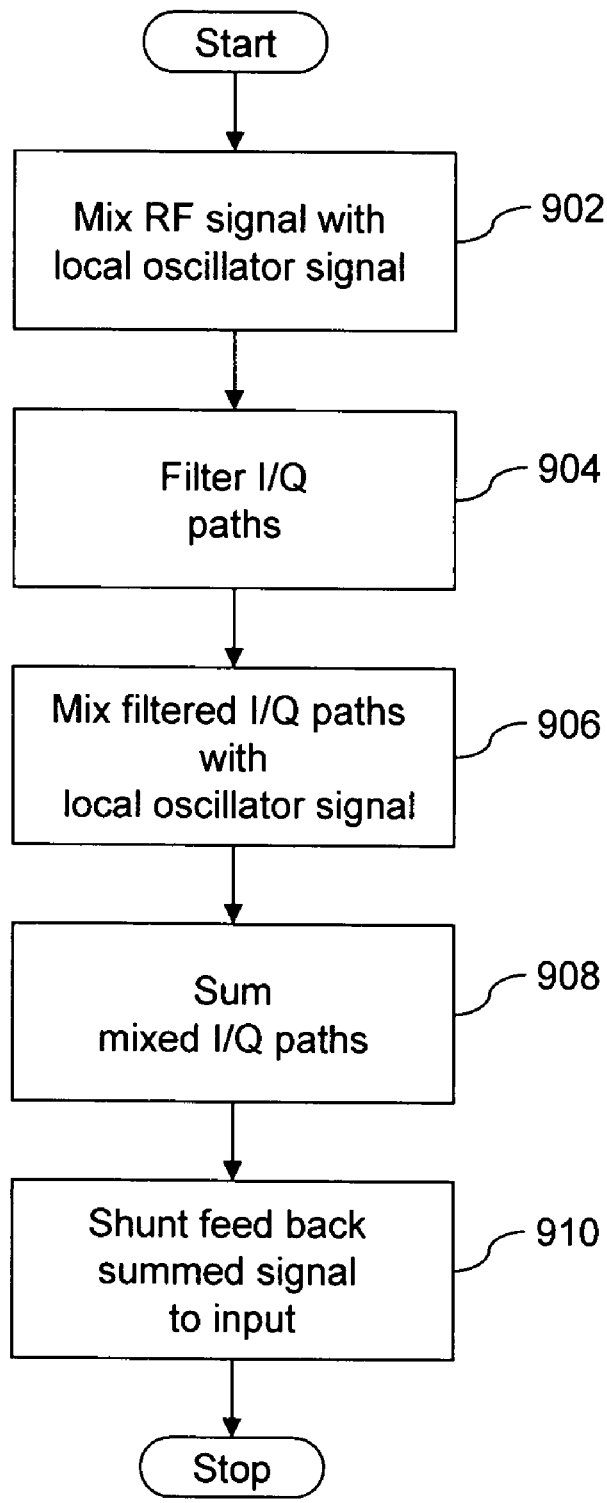
FIG. 9 is a flowchart illustrating a method for generating frequency-dependent impedance, in accordance with an embodiment of the present invention.

FIG. 9 is a flowchart illustrating a method for generating frequency-dependent impedance $Z_{BR}$, in accordance with an embodiment of the present invention. At step 902, a first I/Q mixer mixes input RF signal frequencies with an in-phase (I) and a quadrature phase (Q) first local oscillator signal frequency, to generate first I and Q paths, i.e., first I/Q paths. At step 904, the first I/Q paths are filtered by a pair of fixed-frequency filters. At step 906, a second I/Q mixer mixes the filtered I/Q paths with the same in-phase (I) and the quadrature phase (Q) first local oscillator signal frequency to generate second I and Q paths, i.e., second I/Q paths. At step 908, the second I/Q paths are added by a summing module to generate a baseband signal. At step 910, the baseband signal is scaled by a transconductance amplifier and shunt fed back to the input of the first I/Q mixer, thereby generating the frequency-dependent impedance. For input RF signal frequencies that were mixed by the first I/Q mixer and filtered by the fixed-frequency filters, the frequency-dependent impedance is an open circuit or provides high impedance at the input of the first I/Q mixer. For input RF signal frequencies that were mixed by the first I/Q mixer, passed by the fixed-frequency filters, remixed by the second I/Q mixer, added by the summing module, and shunt fed back to the input through the transconductance amplifier, the frequency-dependent impedance is a short circuit or provides low impedance at the input of the first I/Q mixer.

The method described above is explained with the following equations, assuming the I/Q first local oscillator signal equations to be $$LO_I(t) = \cos(\omega_c t) \ldots \text{(in-phase first local oscillator signal)} \quad (6)$$

$$LO_Q(t) = \sin(\omega_c t) \ldots \text{(quadrature phase first local oscillator signal)} \quad (7)$$

where, $\omega_c$=first local oscillator signal frequency in radian per second

Let the input RF signal be represented by VI($\omega$), where $\omega$=input RF signal frequency in radian per second Applying Fourier transformation to equations (6) and (7), $$LO_I(\omega) = \pi \times [\delta(\omega - \omega_C) + \delta(\omega + \omega_C)] \quad (8)$$

$$LO_Q(\omega) = -j \times \pi \times [\delta(\omega - \omega_C) - \delta(\omega + \omega_C)] \quad (9)$$

After the first mixing, the first I/Q paths represented by, $$V1_I(\omega) = LO_I(\omega) \otimes VI(\omega) \quad (10)$$
$$= \frac{[VI(\omega - \omega_C) + VI(\omega + \omega_C)]}{2}$$

-continued $$V1_Q(\omega) = LO_Q(\omega) \otimes VI(\omega) \quad (11)$$
$$= -j \times \frac{\lfloor VI(\omega - \omega_C) - VI(\omega + \omega_C) \rfloor}{2}$$

After filtering the first I/Q paths, the filtered I/Q paths are represented by, $$V2_I(\omega) = H(\omega) \times V1_I(\omega) \quad (12)$$
$$= \frac{H(\omega) \times \lfloor VI(\omega - \omega_C) + VI(\omega + \omega_C) \rfloor}{2}$$

$$V2_Q(\omega) = H(\omega) \times V1_Q(\omega) \quad (13)$$
$$= -j \times \frac{H(\omega) \times \lfloor VI(\omega - \omega_C) - VI(\omega + \omega_C) \rfloor}{2}$$

Where,

H(ω)=fixed-filter frequency response

After mixing the filtered I/Q paths, the second I/Q paths are represented by, $$V3_I(\omega) = \frac{H(\omega - \omega_C) \times \lfloor VI(\omega) + VI(\omega - 2 \times \omega_C) \rfloor +}{4} \quad (14)$$
$$\frac{H(\omega + \omega_C) \times \lfloor VI(\omega) + VI(\omega + 2 \times \omega_C) \rfloor}{4}$$

$$V3_Q(\omega) = \frac{H(\omega - \omega_C) \times \lfloor VI(\omega) - VI(\omega - 2 \times \omega_C) \rfloor +}{4} \quad (15)$$
$$\frac{H(\omega + \omega_C) \times \lfloor VI(\omega) - VI(\omega + 2 \times \omega_C) \rfloor}{4}$$

After adding the second I/Q paths, the baseband signal is represented by, $$V4(\omega) = VI(\omega) \times \frac{\{H(\omega - \omega_C) + H(\omega + \omega_C)\}}{2} \quad (16)$$
$$= VI(\omega) \times H'(\omega)$$

where,

H'(ω)=frequency translated fixed-filter frequency response

After scaling the baseband signal, it is shunt fed back to the input of the first I/Q mixer, which generates a frequency-dependent impedance ($Z_{BR}$) represented by, $$Z_{BR} = \frac{2}{Gm \times H'(\omega)} \quad (17)$$
$$= \frac{2}{Gm \times [H(\omega - \omega_C) + H(\omega + \omega_C)]}$$

where,

Gm=transconductance gain of the transconductance amplifier

According to equation (17), frequency-dependent impedance $Z_{BR}$ is a function of the first local oscillator signal frequency $\omega_c$. For out-of-band input RF signal frequencies, the denominator of equation (17) approaches zero. Hence, frequency-dependent impedance $Z_{BR}$ approaches infinity or becomes an open circuit. For the in-band signal frequency passed by the pair of fixed-frequency filters, [H(ω−ω_c)+H(ω+ω_c)] equals 1. Hence, according to equation (17), frequency-dependent impedance $Z_{BR}$ equals 2/Gm or becomes a short circuit.

The system and method described above have a number of advantages. The tracking amplifier and the band-pass impedance generator used in the RF tuner, according to the present invention, can be implemented by using Bi-CMOS technology. This eliminates the need for a variable-frequency tracking filter that requires discrete components such as wire-wound inductors, which are difficult to integrate. Further, the RF tuner has improved power dissipation and does away with a SAW filter that is conventionally used in Double Conversion Tuners, thereby improving system integration.

While the foregoing is directed to embodiments of the present invention, other and further embodiments of the invention may be devised without departing from the basic scope thereof, and the scope thereof being determined by the following claims.

What is claimed is:

1. A frequency-dependent impedance generator suitable for use in a radio frequency (RF) tuner, the frequency-dependent impedance generator comprising:
    a) a first I/Q mixer, the first I/Q mixer mixing input RF signals with a first local oscillator signal;
    b) a plurality of fixed-frequency filters, the plurality of fixed-frequency filters filtering the I/Q paths generated by the first I/Q mixer;
    c) a second I/Q mixer, the second I/Q mixer mixing the filtered I/Q paths with the first local oscillator signal;
    d) a summation module, the summation module summing the I/Q paths generated by the second I/Q mixer to generate a baseband signal; and
    e) a transconductance amplifier, the transconductance amplifier shunt feeding back the baseband signal to the first I/Q mixer to generate the frequency-dependent impedance.

2. The frequency-dependent impedance generator according to claim 1, wherein the frequency-dependent impedance generator functions as a notch filter.

3. The frequency-dependent impedance generator according to claim 1, wherein the frequency-dependent impedance generator tracks the first local oscillator signal frequency.

4. The frequency-dependent impedance generator according to claim 1, wherein the first I/Q mixer, the plurality of fixed-frequency filters, the second I/Q mixer, the summation module and the transconductance amplifier are implemented with analog technology.

5. The frequency-dependent impedance generator according to claim 1, wherein the first I/Q mixer, the plurality of fixed-frequency filters, the second I/Q mixer, the summation module and the transconductance amplifier are implemented with Bi-CMOS technology.

6. A tracking amplifier suitable for use in an RF tuner, the tracking amplifier comprising:
    a) a first I/Q mixer, the first I/Q mixer mixing input RF signals with a first local oscillator signal;
    b) a plurality of fixed-frequency filters, the plurality of fixed-frequency filters filtering the I/Q paths generated by the first I/Q mixer;
    c) a second I/Q mixer, the second I/Q mixer mixing the filtered I/Q paths with the first local oscillator signal;
    d) a summation module, the summation module summing the I/Q paths generated by the second I/Q mixer to generate a baseband signal;

e) a transconductance amplifier, the transconductance amplifier shunt feeding back the baseband signal to the first I/Q mixer to generate the frequency-dependent impedance, said elements a through e forming a frequency-dependent impedance generator; and f) an amplifier circuit; the frequency-dependent impedance generator being connected to the amplifier circuit, wherein the frequency-dependent impedance generator and the amplifier circuit generate a frequency-dependent transconductance, the frequency-dependent transconductance generating a frequency-dependent amplifier gain.

7. The tracking amplifier according to claim 6, wherein the frequency-dependent amplifier gain tracks the first local oscillator signal frequency.

8. The tracking amplifier according to claim 6 wherein the tracking amplifier filters the input RF signals to in-band signal.

9. The tracking amplifier according to claim 6, wherein the frequency-dependent impedance generator and the amplifier circuit are implemented with Bi-CMOS technology.

10. A method for generating a frequency-dependent impedance, the method comprising:

a) mixing input RF signals with a first local oscillator signal using a first I/Q mixer;

b) filtering the I/Q paths generated by the first I/Q mixer using a plurality of fixed-frequency filters;

c) mixing the filtered I/Q paths with the first local oscillator signal using a second I/Q mixer;

d) summing the I/Q paths generated by the second I/Q mixer to generate a baseband signal; and e) shunt feeding back the baseband signal to the input of the RF tuner; thereby generating the frequency-dependent impedance.

* * * * *